United States Patent
Schmidt et al.

(10) Patent No.: US 9,646,657 B2
(45) Date of Patent: May 9, 2017

(54) POWER LOSS CAPACITOR TEST USING VOLTAGE RIPPLE

(71) Applicant: Intel Corporation, Santa Clara, CA (US)

(72) Inventors: Kai-Uwe Schmidt, Vancouver (CA); Andrew Morning-Smith, Vancouver (CA); Adrian Mocanu, Langley (CA); Mike M. Ngo, Beaverton, OR (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 14/845,373

(22) Filed: Sep. 4, 2015

(65) Prior Publication Data

US 2017/0069356 A1    Mar. 9, 2017

(51) Int. Cl.
*G11C 5/14*     (2006.01)
*H02J 7/00*     (2006.01)
*H02J 7/34*     (2006.01)
*G01R 31/30*    (2006.01)
*G01R 21/00*    (2006.01)
*G01R 27/26*    (2006.01)

(52) U.S. Cl.
CPC ............ *G11C 5/148* (2013.01); *H02J 7/0068* (2013.01); *G01R 21/006* (2013.01); *G01R 27/2688* (2013.01); *G01R 31/3004* (2013.01); *H02J 7/345* (2013.01)

(58) Field of Classification Search
CPC ......... G11C 5/148; H02J 7/0068; H02J 7/345; G01R 21/006; G01R 27/2688; G01R 31/3004

USPC .......................................... 365/226; 324/601
See application file for complete search history.

(56) References Cited

U.S. PATENT DOCUMENTS

| | | | |
|---|---|---|---|
| 7,619,457 B1 | 11/2009 | Mai | |
| 2005/0110977 A1* | 5/2005 | LaBelle | G01S 7/497 356/6 |
| 2006/0250144 A1 | 11/2006 | Braun et al. | |
| 2007/0075790 A1* | 4/2007 | Liao | H02M 3/156 331/36 C |
| 2009/0073140 A1* | 3/2009 | Fujita | H03K 17/962 345/174 |
| 2011/0279131 A1* | 11/2011 | Kim | G06F 3/044 324/679 |
| 2012/0161792 A1 | 6/2012 | Ikeda et al. | |
| 2014/0062940 A1* | 3/2014 | Al-Dahle | G06F 3/0412 345/174 |

(Continued)

FOREIGN PATENT DOCUMENTS

WO    2015/092598 A1    6/2015

OTHER PUBLICATIONS

International Search Report and Written Opinion, Mailed Date: Oct. 28, 2016, Application No. PCT/US2016/047625, Filed Date: Aug. 18, 2016, pp. 9.

*Primary Examiner* — Toan Le

(57) ABSTRACT

These present disclosure provides techniques to determine the capacitance of a power loss capacitor based on voltage ripple. The power loss capacitor may be a power loss capacitor for a power loss shutdown system of a solid state drive. The capacitance may be determined as a function of the voltage ripple and a period of the voltage ripple during a natural discharge and a controlled discharge of the power loss capacitor.

22 Claims, 10 Drawing Sheets

(56) References Cited

U.S. PATENT DOCUMENTS

2015/0028887 A1* 1/2015 Hanssen .............. G01R 21/006
   324/601
2015/0160277 A1   6/2015 Seo et al.

\* cited by examiner

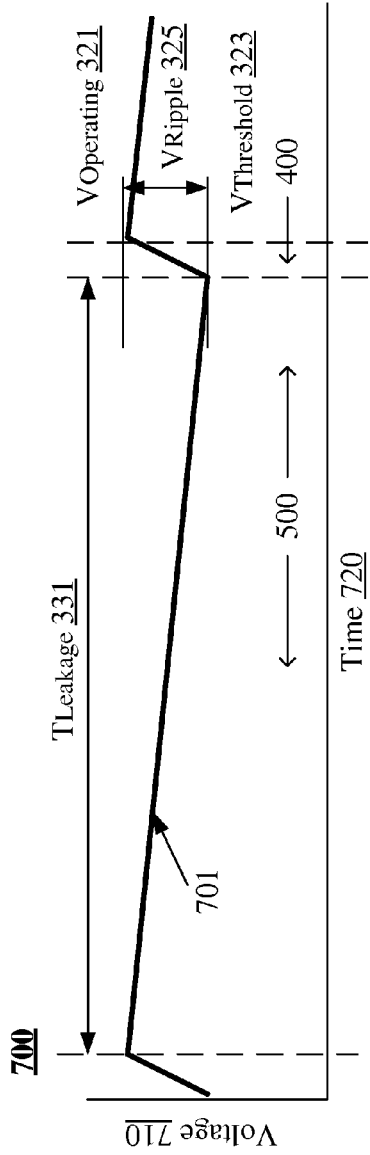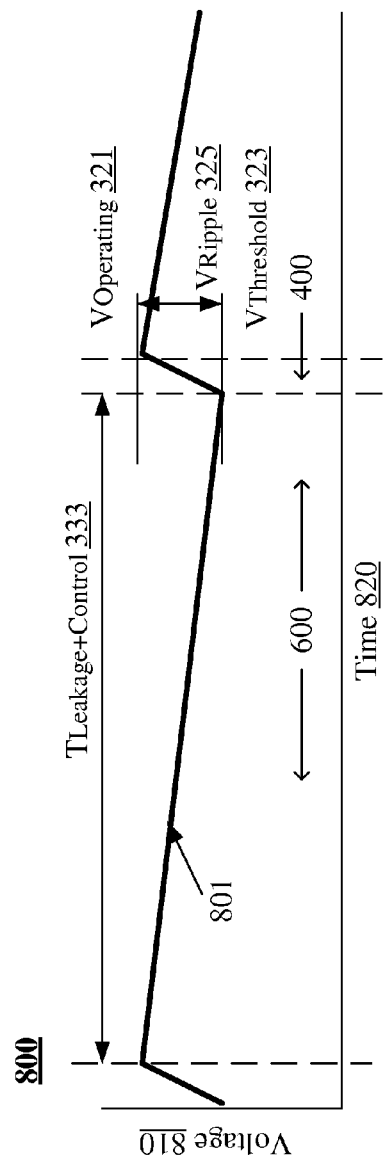
FIG. 7
FIG. 8

900

Determine a first discharge time between a first time and a second time during that a voltage across the capacitor drops from an operating voltage to a threshold voltage.
910

Determine a second discharge time that the voltage across the capacitor drops from the operating voltage to the threshold voltage in response to discharging a control current from the capacitor.
920

Determine a capacitance of the capacitor based on the first discharge time and the second discharge time.
930

FIG. 9

POWER LOSS CAPACITOR TEST USING VOLTAGE RIPPLE

TECHNICAL FIELD

Examples described herein are generally related to solid state drives and more specifically to testing power loss systems within Solid State Drives.

BACKGROUND

In a solid state drive (SSD), the SSD must go through an orderly shutdown in the event of a loss of power to prevent corruption or loss of data. In particular, in the event of a loss of power, the SSD must complete all in progress data writes and provide a controlled shutdown of the media and firmware. Modern SSDs may include a power loss system that provides sufficient energy to complete these in process data writes and allow for a controlled shutdown of the SSD. For example, a set of power loss capacitors may be used to provide sufficient energy storage to provide power for shutdown operations in the event of a loss of power.

During operation, the SSD may periodically test the power loss capacitors. For example, the SSD may periodically measure the capacitance of the power loss capacitors to determine whether the capacitance has degraded. If degradation is detected, a notification can be made to a host system coupled to the SSD to alert the host system that the power loss capacitors may have insufficient energy storage to protect data integrity in the event of a loss of power.

Testing the power loss capacitors may be facilitated by discharging the capacitors using a known load. The discharge may be measured for a specific voltage drop or for a specific discharge time. Discharging the capacitors using a known load lowers the voltage of the capacitors below their normal operating range. As such, current SSD power loss capacitors must be sized such that their minimum operating voltage, even during testing, is sufficient to protect data integrity in the event of a loss of power.

BRIEF DESCRIPTION OF THE DRAWINGS

FIG. 7 illustrates an example first voltage waveform of the example third system.
FIG. 8 illustrates an example second voltage waveform of the example third system.
FIG. 9 illustrates an example logic flow.

DETAILED DESCRIPTION

As contemplated in the present disclosure, power loss capacitors may be tested based on a voltage ripple associated with refreshing the voltage of the power loss capacitors. During normal operation of an SSD, the power loss capacitors within the SSD may have their voltage maintained by charging pulses that are injected whenever the voltage of the capacitors drops below a certain threshold. More specifically, when the voltage of the power loss capacitors drops to a threshold voltage, current may be injected to charge the capacitors back up to an operating voltage. The difference between the operating voltage and the threshold voltage is referred to as the ripple voltage. The present disclosure provides techniques and systems to determine the capacitance of the power loss capacitors based on the voltage ripple, and specifically, based on the period of the voltage ripple or based on the voltage ripple over a fixed period.

According to some examples, an SSD device may include a power loss capacitor capacitance measurement component for which logic and/or features of the SSD device may determine the capacitance of the power loss capacitors based on a time associated with the voltage ripple. For example, the capacitance measurement component may measure a first time between charging pulses associated with the voltage ripple for an assumed natural leakage current causing voltage drop and may measure a second time between charging pulses associated with the voltage ripple for the assumed natural leakage combined with a controlled current draw on the power loss capacitors. The capacitance measurement component may determine the capacitance based on the first measured time and the second measured time.

Figure 1:
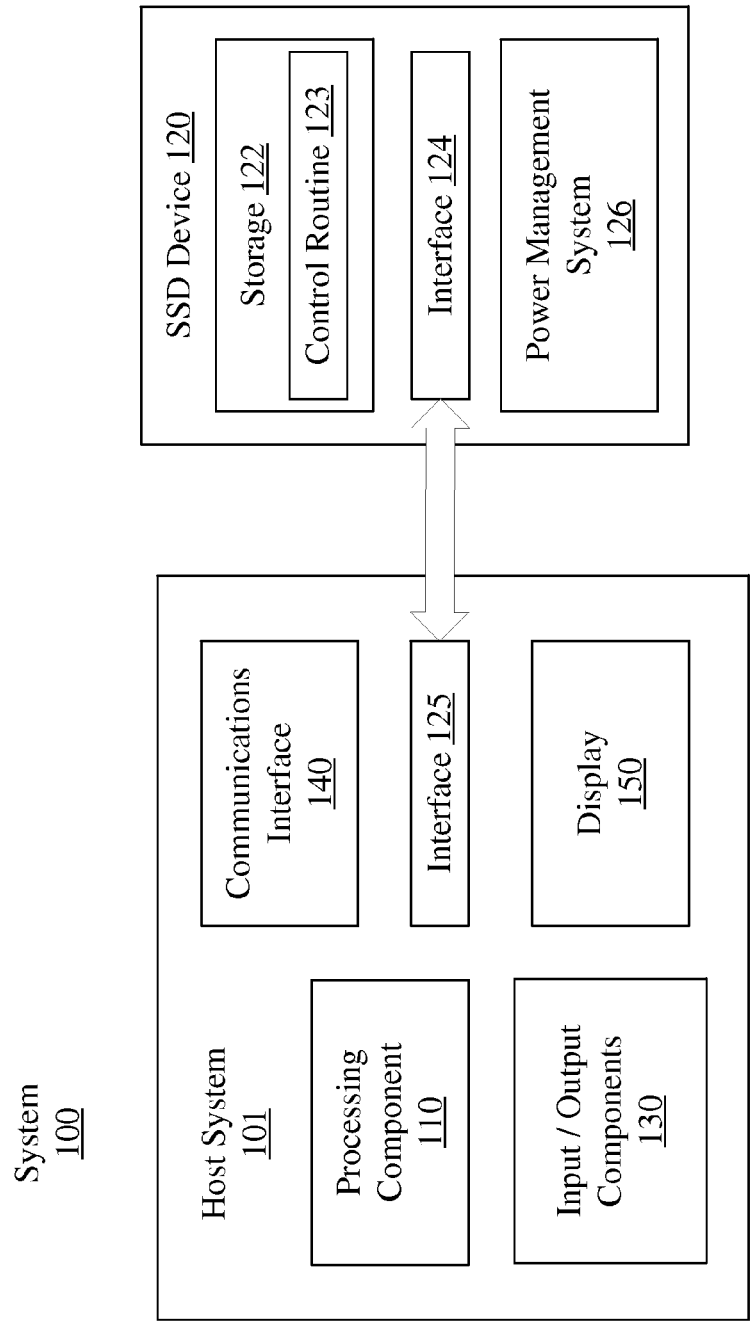
FIG. 1 illustrates an example first system.

FIG. 1 illustrates an example first system. As shown in this figure, the example first system includes a system 100. In some examples, system 100 is depicted as a simplified block diagram for a computing device including a host system 101 and a SSD device 120. As depicted, the host system 101 and the SSD device 120 are operably coupled. With some examples, the host system 101 and the SSD device 120 may be implemented in separate housings. With some examples, the host system 101 and the SSD device 120 may be implemented in the same housing. Examples are not limited in this context.

The SSD device 120 may be made up, at least in part, of storage 122, interface 124, and a power management system 126. The storage 122 may include a control routine (e.g., firmware, or the like) 123. In general, the storage 122 may include logic, a portion of which includes arrays of integrated circuits, forming non-volatile memory to persistently store data or a combination of non-volatile memory and volatile memory. It is to be appreciated, that the SSD device 100, and particularly the storage 122 may be based on any of a variety of technologies. In particular, the arrays of integrated circuits included in storage 122 may be arranged to form one or more types of memory, such as, for example, NAND memory, NOR memory, 3-Dimensional cross-point memory, ferroelectric memory, silicon-oxide-nitride-oxide-silicon (SONOS) memory, polymer memory such as ferroelectric polymer memory, ferroelectric transistor random access memory (FeTRAM or FeRAM), nanowire, phase change memory, phase change memory with switch, magnetoresistive random access memory (MRAM), spin transfer torque (STT) memory, or the like.

The interface 124 may be any of a variety of interfaces to operably connect the SSD device 120 to the host system 101. In particular, the interface 124 may be configured to operably connect to interface 125 within the host system 101. With some examples, the interfaces 124 and/or 125 may be universal serial bus (USB) interfaces, SAS (e.g., serial attached small computer system interface (SCSI)) interfaces, serial AT attachment (SATA) interfaces, peripheral component interconnect express (PCIe) interfaces, non-volatile memory express (NVMe) interfaces, or the like.

The interfaces 124 and 125 may be configured to receive and/or transmit information elements and/or control signals between the SSD device 120 and the host system 101. For example, the interface 124 may receive information elements (e.g., via interface 125) to include an indication of data to store in the storage 122. As another example, the interface 124 may send a control signal to the host system (e.g., via the interface 125) to include an indication that the SSD device 120 is operating correctly. As another example, the interface 124 may send a control signal to a host (e.g., the system 100) to include an indication that the power management system 126 is not operating correctly. In particular, the control signal may include an indication that the capacitors (see FIG. 2) do not have sufficient capacitance to protect data integrity in the event of a loss of power.

In some examples, the power management system 126 may send a control signal to a power management integrated circuit (PMIC) of the host system to include an indication regarding the state of the capacitor. In particular, the power management system 126 may send a control signal based on one or more PCIe SMART attributes. For example, the power management system 126 may send a control signal to set a flag in accordance with the NVM Express Specification, version 1.0e, published Jan. 23, 2013. The control signal may, for example, set a flag for the fourth bit of the log identifier 02h, which indicates that a memory backup system has failed.

The power management system 126 may include logic and/or features to provide an orderly shutdown of the SSD device 120 in the event of a loss of power. The power management system 126 is described in greater detail with respect to FIGS. 2-3. However, in general, the power management system 126 may include an energy storage component, such as, for example, a set of power loss capacitors and a charging component. The control routine 123 may include logic and/or features to charge the capacitors to an operating voltage and to maintain the capacitors charge at the operating voltage. More specifically, the control routine may include logic and/or features to charge the capacitors to the operating voltage and to recharge the capacitors to the operating voltage when the capacitor voltage has dropped to a threshold level. Additionally, during a power loss event, the control routine 123 may include logic and/or features to finish any data writes in progress (e.g., complete all pending writes to storage 122, or the like) and to orderly shutdown the SSD device 120.

The power management system 126 may also include a capacitance measurement component to determine the capacitance of the power low capacitors based on the time between charges of the capacitors, or said differently, the time between capacitor voltage dropping from the operating voltage to the threshold voltage. More specifically, the control routine 123 may include logic and/or features to measure the time between charging pulses (e.g., current pulses used to charge the capacitor voltage from the threshold voltage to the operating voltage) corresponding to both a voltage drop resulting from natural leakage of the capacitors and from a controlled leakage of the capacitors.

Figure 2:
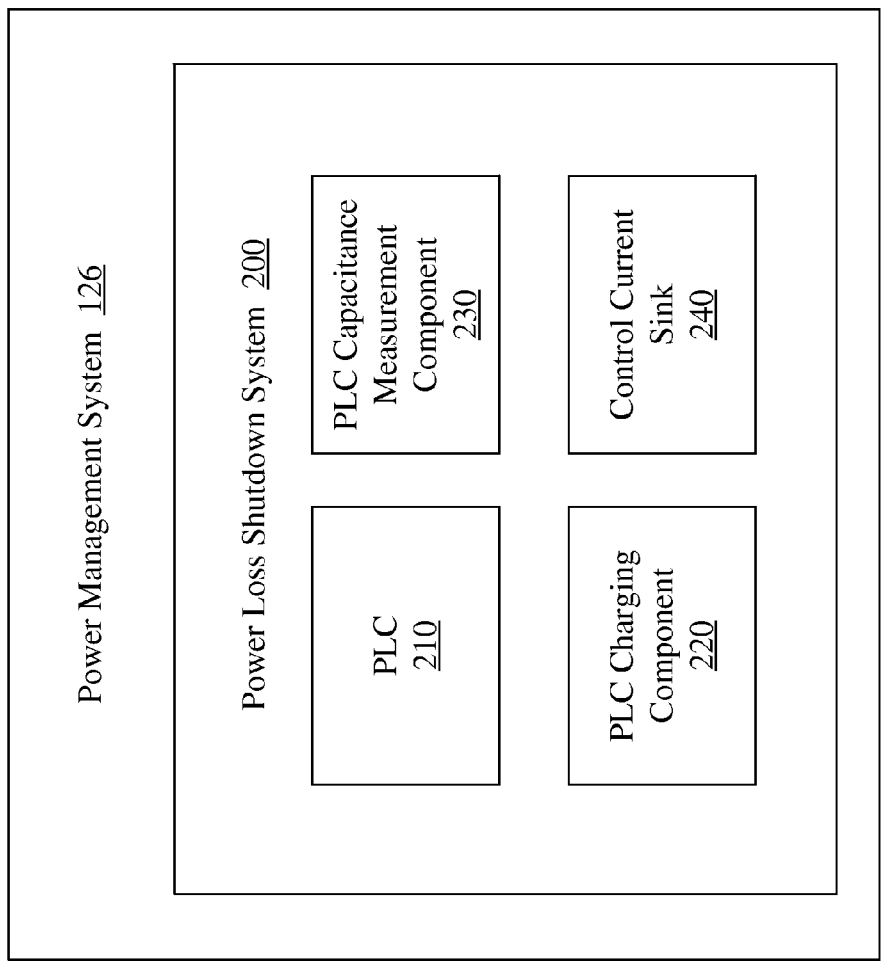
FIG. 2 illustrates an example second system.
Figure 3:
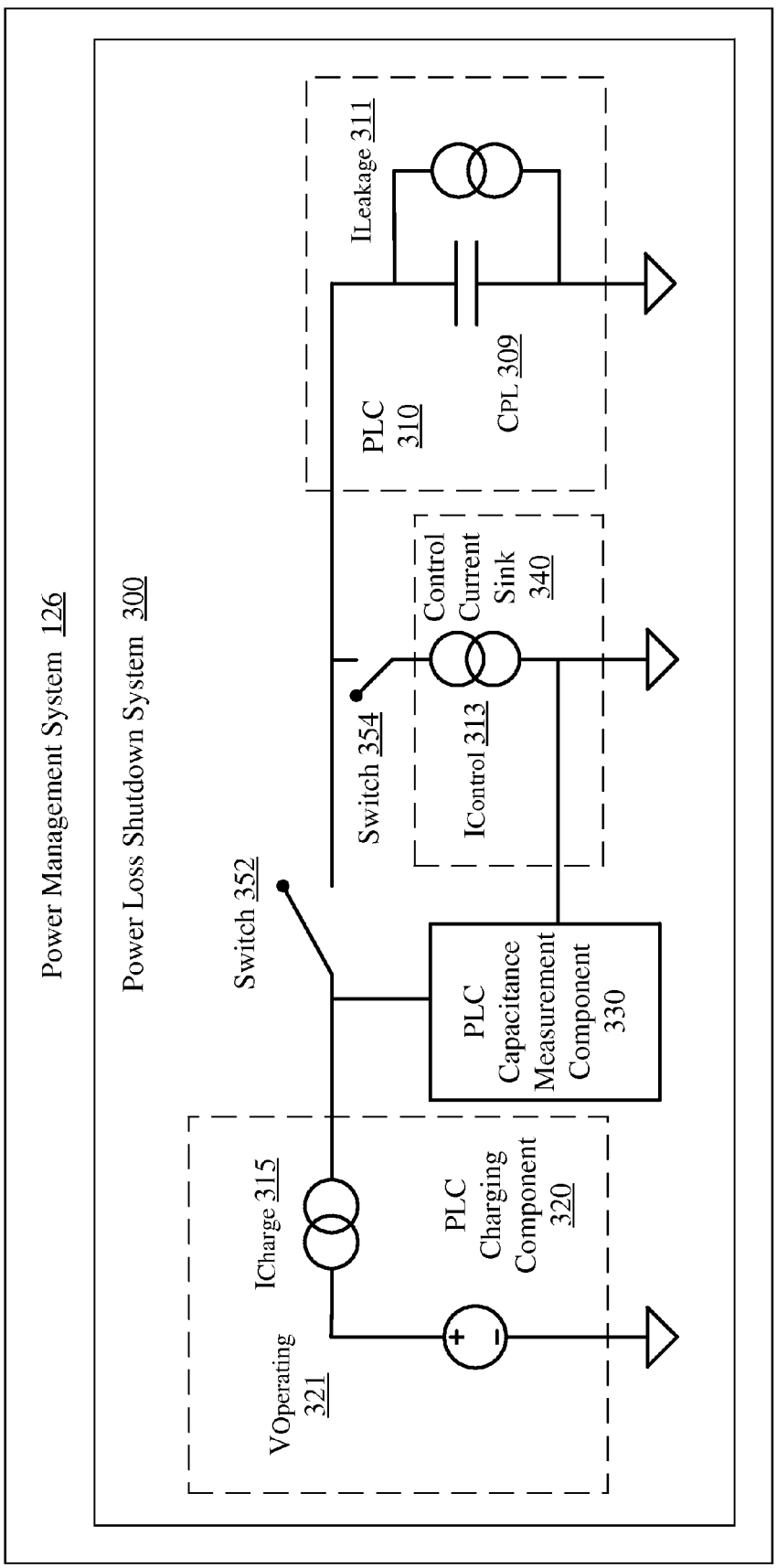
FIG. 3 illustrates an example third system.
Figure 4:
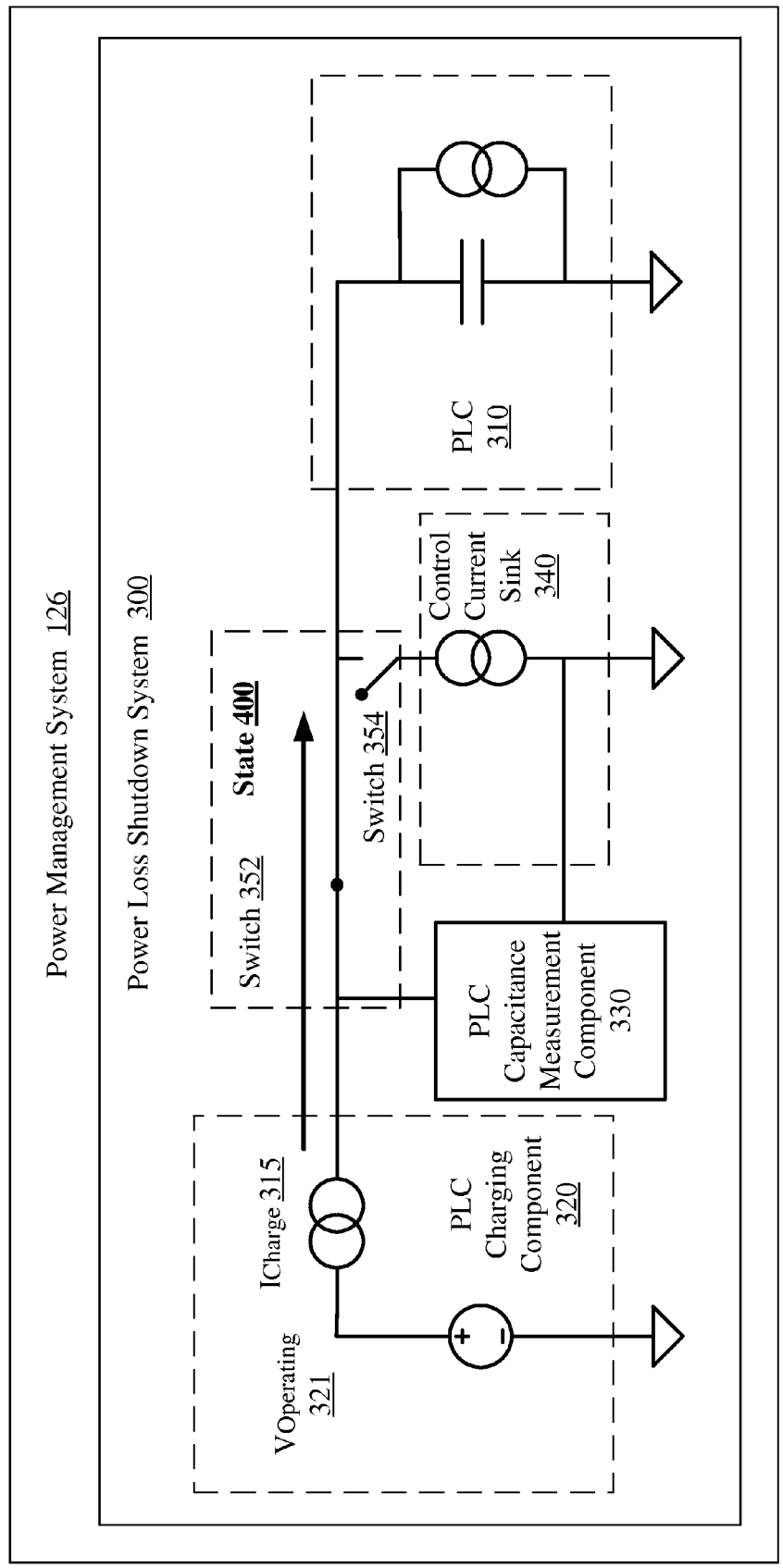
FIG. 4 illustrates an example first state of the example third system.
Figure 5:
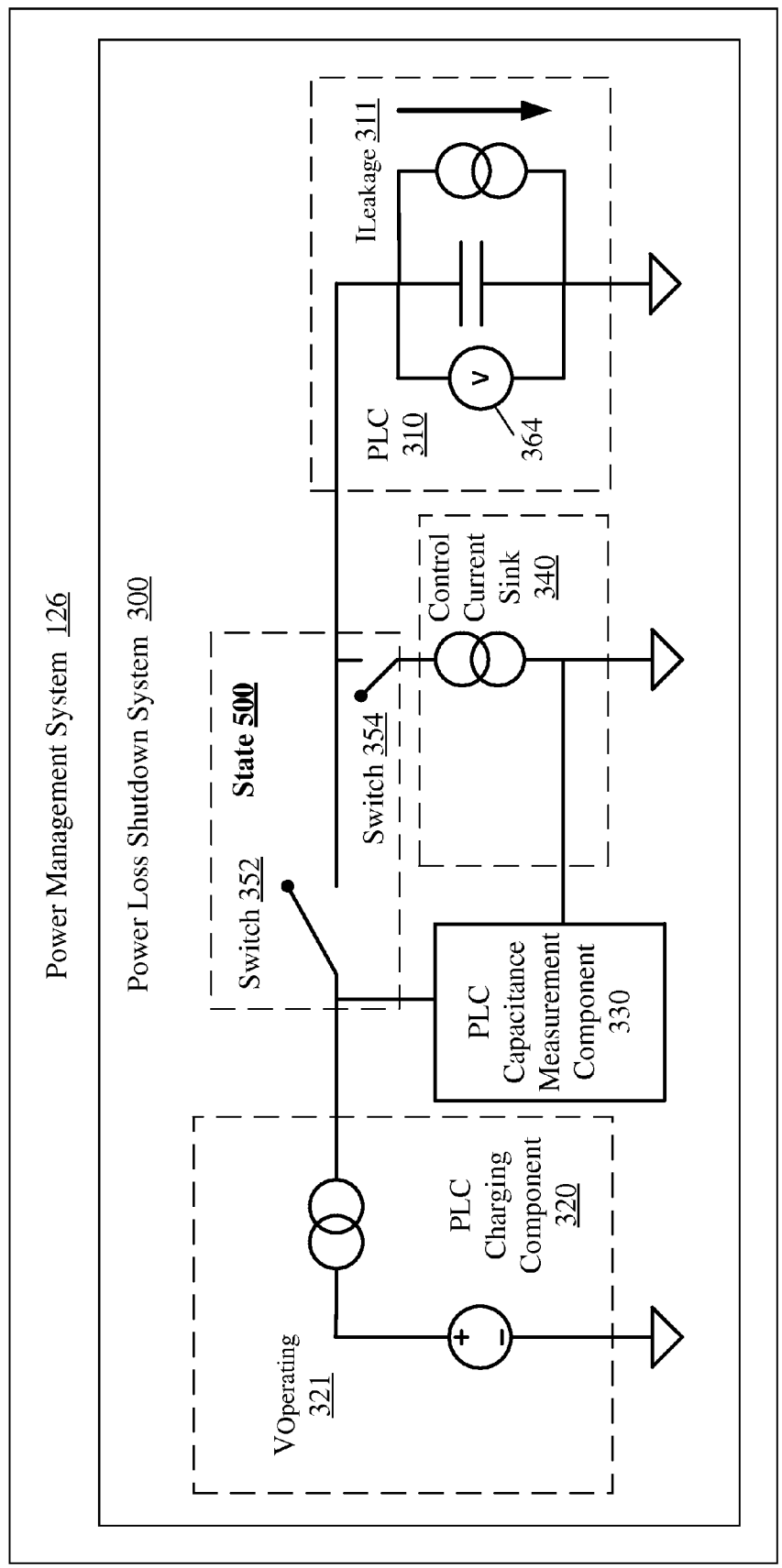
FIG. 5 illustrates an example second state of the example third system.
Figure 6:
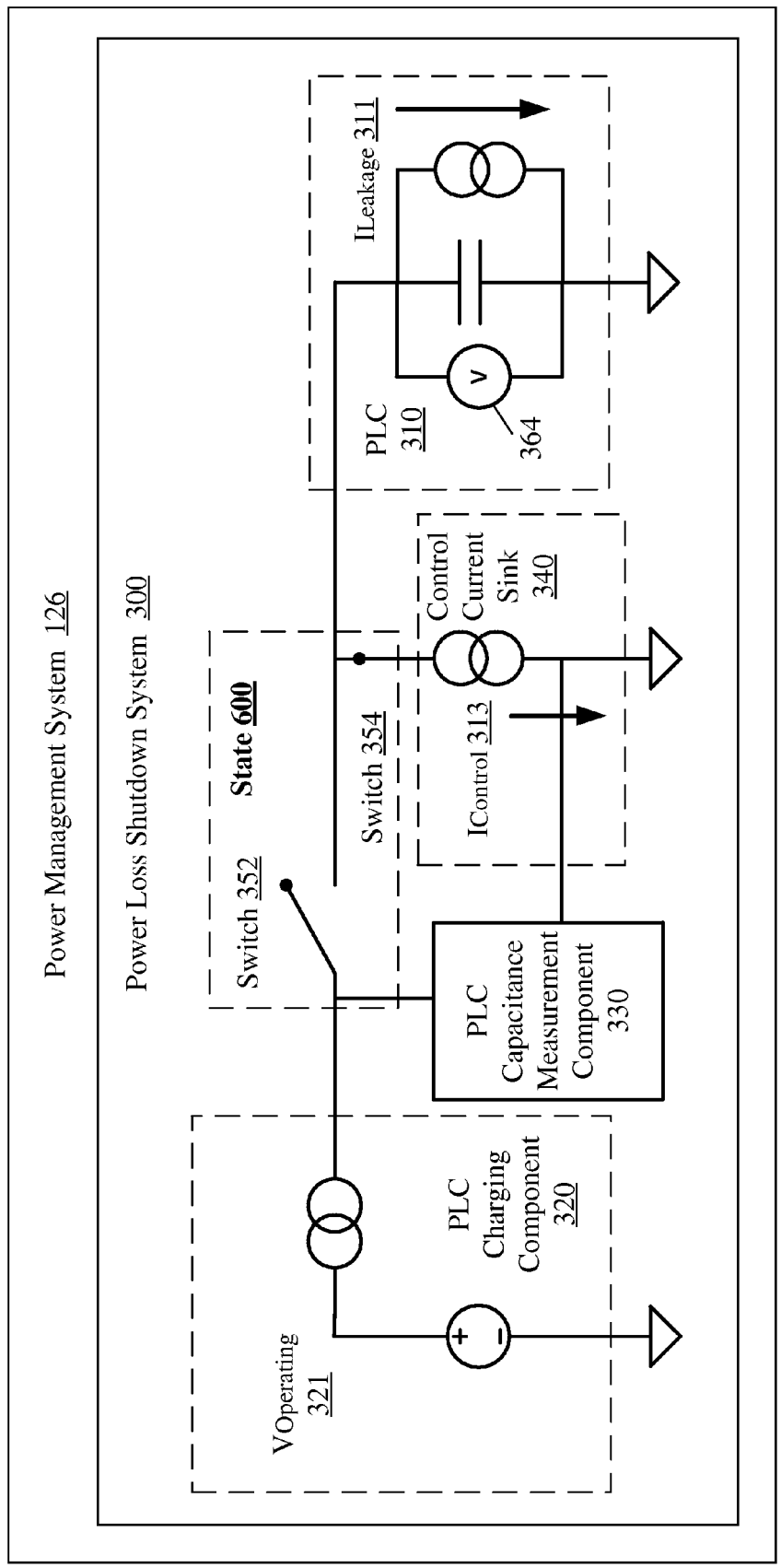
FIG. 6 illustrates an example third state of the example third system.

Various examples of the power management system 126 and example operation of the power management system 126 are described in greater detail with reference to FIGS. 2-6. In particular, FIG. 2 depicts, in block diagram form, an example of the power management system 126 including a power loss shutdown system (PLSS) 200 while FIG. 3 depicts, in circuit diagram form, an example PLSS 300. FIGS. 4-6 depict example operating states of the example PLSS 300 depicted in FIG. 3.

It is important to note, with some examples, the present disclosure may include just the SSD device 120. In other examples, just the power management system 126 may be provided. However, with other examples, the SSD 120 may be incorporated into system 100, as depicted in FIG. 1, to include other computing components as described herein. As such, the system 100 is described in greater detail, after which, examples of the power management system 126 are described.

In some examples, as shown in FIG. 1, system 100 may additionally include a processing component 110, the SSD 120, input and/or output components 130, communications interface 140, or a display 150. With some examples, the processor component 110 may include circuity to processor logic, such as, for example, any of a variety of commercial processors. In some examples, the processor component 110 may include multiple processors, a multi-threaded processor, a multi-core processor (whether the multiple cores coexist on the same or separate dies), and/or a multi-processor architecture of some other variety by which multiple physically separate processors are in some way linked. Additionally, in some examples, the processor component 110 may include graphics processing portions and may include dedicated memory, multiple-threaded processing and/or some other parallel processing capability.

In various examples, the input and/or output components 130 may include one or more component to provide input to or to provide output from the system 100. For example, the input and/or output components 130 may be a keyboard, mouse, joystick, microphone, track pad, speaker, haptic feedback device, or the like. In various embodiments, the display 150 may be based on any of a variety of displays (e.g., Plasma, LCD, LED, OLED, or the like) for displaying images and may include touch functionality.

In some examples, communications interface 140 may include logic and/or features to support a communication interface. For these examples, communications interface 140 may include one or more communication interfaces that operate according to various communication protocols or standards to communicate over direct or network communication links Direct communications may occur via use of communication protocols or standards described in one or more industry standards (including progenies and variants) such as those associated with the SMBus specification or the PCI Express specification. Network communications may occur via use of communication protocols or standards such those described in one or more Ethernet standards promulgated by the Institute of Electrical and Electronics Engineers (IEEE). For example, one such Ethernet standard may include IEEE 802.3-2008, Carrier sense Multiple access with Collision Detection (CSMA/CD) Access Method and Physical Layer Specifications, Published in December 2008 (hereinafter "IEEE 802.3").

According to some examples, communications interface 140 may also include logic and/or features for SSD device 120 to communicate with other components of system 100 (e.g., processor component 110, input/output components 130, display 150, or the like).

System 100 may be part of a host computing platform that may be, for example, a server, a server array or server farm, a web server, a network server, an Internet server, a work station, a mini-computer, a main frame computer, a super-computer, a network appliance, a web appliance, a distributed computing system, multiprocessor systems, processor-based systems, or combination thereof. Accordingly, functions and/or specific configurations of system 100 described herein, may be included or omitted in various embodiments of system 100, as suitably desired.

The components and features of system 100 may be implemented using any combination of discrete circuitry, application specific integrated circuits (ASICs), logic gates and/or single chip architectures. Further, the features of system 100 may be implemented using microcontrollers, programmable logic arrays and/or microprocessors or any combination of the foregoing where suitably appropriate. It is noted that hardware, firmware and/or software elements may be collectively or individually referred to herein as "logic" or "circuit."

It should be appreciated that the example SSD device 120 or system 100 shown in the block diagram of FIG. 1 may represent one functionally descriptive example of many potential implementations. Accordingly, division, omission or inclusion of block functions depicted in the accompanying figures does not infer that the hardware components, circuits, software and/or elements for implementing these functions would necessarily be divided, omitted, or included in examples.

Turning now to FIG. 2, an example of the power management system 126 is illustrated. In some examples, the power management system 126 of FIG. 1 may be implemented to include the PLSS 200. The PLSS 200 may include a power loss capacitor (PLC) 210, a PLC charging component 220, a PLC capacitance measurement component 230, and a control current sink 240.

In some examples, the PLC 210 may be implemented as a single capacitor. In other examples, the PLC 210 may be implemented as multiple capacitors arranged in series, parallel, or a series-parallel configuration. In general, the PLC 210 is configured to store energy that may be used in the event of a loss of power to complete any pending writes and/or to orderly shutdown an SSD device (e.g., the SSD device 120, or the like) as described herein.

The PLC charging component 220 may include logic and/or features to charge the PLC 210 to an operating voltage and to maintain (e.g., recharge, periodically charge, or the like) the PLC 210 at the operating voltage. In particular, the PLC charging component 220 may be configured to charge the PLC 210 to the operating voltage and then to recharge the PLC 210 to the operating voltage when the PLC 210 voltage drops to a threshold voltage. It is to be appreciated, that during operation, the PLC 210 may naturally leak current. As such, the voltage of the PLC 210 may degrade over time and need to be recharged via an injection of current, or a current pulse, to charge the PLC 210 back up such that the PLC 210 voltage reaches the operating voltage.

The PLC capacitance measurement component 230 may include logic and/or features to measure a time between these charging pulses. Said differently, the PLC capacitance measurement component 230 may be configured to measure a first time between when the voltage of the PLC 210 reaches the operating voltage and when the voltage reaches the threshold voltage due to the natural leakage of the PLC 210. Additionally, the PLC capacitance measurement component 230 may be configured to discharge the PLC 210 from the operating voltage to the threshold voltage using the control current sink 240 and to measure a second time between when the voltage of the PLC 210 reaches the operating voltage and when the voltage reaches the threshold voltage due to the natural leakage of the PLC 210 and current drawn by the control current sink 240.

In some examples, the PLC capacitance measurement circuit 230 may determine the capacitance of the PLC 210 as a quotient, with the dividend the product of the control current and the second time and the divisor the product of the difference between the operating voltage and the threshold voltage and the difference between 1 and the second time divided by the first time. This is explained in greater detail below (refer to FIGS. 7-8).

The control current sink 240 may be any of a variety of current sinks to absorb a known amount of current over time. In particular, the control current sink 240 may be logic and/or features to simulate a load having a particular current draw.

Turning now to FIG. 3, an example of the power management system 126 of FIG. 1, including a PLSS 300 is illustrated. The PLSS 300 may include a power loss capacitor (PLC) 310, a PLC charging component 320, a PLC capacitance measurement component 330, and a control current sink 340. It is important to note, that the symbols "I" is used herein to denote current, the symbol "V" is used herein to denote voltage, and the symbol "T" is used herein to denote a period of time.

As depicted, the PLC 310 comprises a single capacitor having a capacitance 309 ($C_{PL}$). It is noted, the PLC 310 may be a single capacitor or multiple capacitors. During operation, the PLC 310 may have a corresponding leakage current 311 ($I_{Leakage}$). Said differently, the PLC 310 may naturally leak an unknown amount of current which causes the voltage of the PLC 310 to drop over time (refer to FIG. 5). This leakage current is referred to as $I_{Leakage}$ 311.

The PLC charging component 320 may comprise a power source to inject a charge current 315 ($I_{charge}$) to charge the PLC 310 to an operating voltage 321 ($V_{Operating}$). In particular, the PLC charging component 320 may be electrically coupled to the PLC 310 via a charging switch 352. The charging switch 352 may be closed (refer to FIG. 4) to charge the PLC 310 to $V_{Operating}$ 321. More specifically, the charging switch 352 may be closed to initially charge the PLC 310 to $V_{Operating}$ 321 or to subsequently charge the PLC 310 to $V_{Operating}$ 321 from a lower voltage (e.g., a threshold voltage ($V_{Threshold}$), or the like). In particular, the PLC 310 may be charged from a $V_{Threshold}$ (refer to $V_{Threshold}$ 323 shown in FIGS. 7-8) to $V_{Operating}$ 321

The control current sink 340 may be electrically coupled to the PLC 310 via a controlled discharge switch 354. The controlled discharge switch 354 may be closed (refer to FIG. 6) to perform a controlled discharge of the PLC 310 from $V_{Operating}$ 321 to $V_{Threshold}$ 323. In particular, the control current sink 340 may include logic to provide a controlled drain current 313 ($I_{Control}$) to discharge the PLC 310.

The PLC capacitance measurement component 330 may include logic and/or features to measure a time to discharge the PLC 310 from $V_{Operating}$ 321 to $V_{Threshold}$ 323 due to both leakage current (e.g., $I_{Leakage}$ 311, or the like) and both leakage current and the controlled drain current (e.g., $I_{Leakage}$ 311 and $I_{Control}$ 313). Additionally, the PLC capacitance measurement component 330 may include logic and/or features to determine the capacitance of the PLC 310 based on these measured times. This is described in greater detail below with reference to FIGS. 4-8. Additionally, the PLC capacitance measurement component 330 may include logic and/or features to send a control signal to a host (e.g., the SSD drive 120, the system 100, or the like) to include an indication that the PLC 310 has insufficient capacitance to store energy to provide a controlled shutdown as required to protect data integrity. More specifically, the PLC capacitance measurement component 330 may determine the capacitance of the PLC 310 and may determine whether the capacitance is below a threshold capacitance. Based on a determination that the capacitance is below a threshold capacitance, the PLC capacitance measurement component 330 may send a control signal to include an indication the PLSS 300 may not protect data integrity in the event of a loss of power.

FIGS. 4-6 describe various states of the PLSS 300 while FIGS. 7-8 illustrate voltage waveforms corresponding to the states of the PLSS 300. Accordingly, FIGS. 4-6 will be described with reference to the voltage waveforms of FIGS. 7-8. It is noted, that these figures are described in conjunction with the PLSS 300 of FIG. 3. However, it is to be appreciated, that the operation of the PLC capacitance measurement component 330 described herein may be implemented by the PLC 230 or the PLSS 126 of the SSD 120.

Turning more specifically to FIG. 4, the PLSS 300 is depicted in a charging state 400 with the charging switch 352 closed and the controlled discharge switch 354 open. As such, charge current (e.g., $I_{charge}$ 315) may flow from the PLC charging component 320 to the PLC 310 to charge the PLC 310 to the operating voltage (e.g., $V_{Operating}$ 321). Once the voltage of the PLC 310 reaches the operating voltage, the state of the PLSS 300 may change to either a natural discharge state (refer to FIG. 5) or a controlled discharge state (refer to FIG. 6).

Turning more specifically to FIG. 5, the PLSS 300 is depicted in a natural discharging state 500 with the charging switch 352 open and the controlled discharge switch 354 open. As such, leakage current (e.g., $I_{Leakage}$ 311) may flow from the PLC 310 to cause a voltage drop across the PLC 310. In particular, the voltage may drop from the operating voltage (e.g., $V_{Operating}$ 321) to the threshold voltage (e.g., $V_{Threshold}$ 323) due to the leakage current (e.g., $I_{Leakage}$ 311) of the PLC 310. In some examples, the voltage drop may be measured across the PLC 310, for example, by a voltmeter 364, or the like. As described above, when the voltage of the PLC 310 drops to the $V_{Threshold}$ 323, the PLC charging component may place the PLSS 300 in the charging state 400. As such, the state may switch from 500 to 400.

Turning more specifically to FIG. 6, the PLSS 300 is depicted in a controlled discharging state 600 with the charging switch 352 open and the controlled discharge switch 354 closed. When the charging switch 352 is open and the controlled discharge switch 354 is closed, there is two current flows from the PLC 310. In particular, a first current flows from the PLC 310 to ground due to the leakage current (e.g., $I_{Leakage}$ 311) and a second current flows from the PLC 310 to ground due to the controlled current drain (e.g., $I_{Control}$ 313), resulting a voltage drop across the PLC 310. In particular, the voltage may drop from the operating voltage (e.g., $V_{Operating}$ 321) to the threshold voltage (e.g., $V_{Threshold}$ 323) due to the leakage current (e.g., $I_{Leakage}$ 311) of the PLC 310 and the controlled drain current (e.g., $I_{Control}$ 313) of the PLC 310 due to the control current sink 340. In some examples, the voltage drop may be measured across the PLC 310, for example, by a voltmeter 364, or the like. As described above, when the voltage of the PLC 310 drops to the $V_{Threshold}$ 323, the PLC charging component may place the PLSS 300 in the charging state 400. As such, the state may switch from 600 to 400.

Turning more specifically to FIG. 7, a voltage waveform 700 is depicted. The voltage waveform 700 may correspond to a voltage 701 of the PLC 310 during states 400 and 500. In particular, the voltage waveform 700 depicts the voltage 701 of the PLC 310 as it fluctuates between the operating voltage (e.g., $V_{Operating}$ 321) and the threshold voltage (e.g., $V_{Threshold}$ 323). More specifically, during state 400 (refer to FIG. 4) the PLC 310 is charged to $V_{Operating}$ 321. Once the voltage of the PLC 310 reaches $V_{Operating}$ 321, the state of the PLSS 300 may be changed to the naturally discharging state 500 (refer to FIG. 5). During state 500, the voltage 701 of the PLC 310 may drop from $V_{Operating}$ 321 to $V_{Threshold}$ 323 due to the current leakage (e.g., $I_{Leakage}$ 311). The difference between $V_{Operating}$ 321 and $V_{Threshold}$ 323 is depicted as $V_{Ripple}$ 325. Once the voltage 701 of the PLC 310 drops to the $V_{Threshold}$ 323, the state may change back to the charging state 400. The time between when the voltage 701 of the PLC 310 reaches $V_{Operating}$ 321 and drops to $V_{Threshold}$ 323 is depicted as $T_{Leakage}$ 331.

Turning more specifically to FIG. 8, a voltage waveform 800 is depicted. The voltage waveform 800 may correspond to a voltage 801 of the PLC 310 during states 400 and 600. In particular, the voltage waveform 800 depicts the voltage 801 of the PLC 310 as it fluctuates between the operating voltage (e.g., $V_{Operating}$ 321) and the threshold voltage (e.g., $V_{Threshold}$ 323). More specifically, during state 400 (refer to FIG. 4) the PLC 310 is charged to $V_{Operating}$ 321. Once the voltage of the PLC 310 reaches $V_{Operating}$ 321, the state of the PLSS 300 may be changed to the controlled discharging state 600 (refer to FIG. 6). During state 600, the voltage 801 of the PLC 310 may drop from $V_{Operating}$ 321 to $V_{Threshold}$ 323 due to the current leakage (e.g., $I_{Leakage}$ 311) and the controlled drain current (e.g., $I_{Control}$ 313). The difference between $V_{Operating}$ 321 and $V_{Threshold}$ 323 is depicted as $V_{Ripple}$ 325. Once the voltage 801 of the PLC 310 drops to the $V_{Threshold}$ 323, the state may change back to the charging state 400. The time between when the voltage 801 of the PLC 310 reaches $V_{Operating}$ 321 and drops to $V_{Threshold}$ 323 is depicted as $T_{Leakage+Control}$ 333.

Referring again to FIG. 3, the PLC capacitance measurement component 330 may be configured to determine the capacitance $C_{PL}$ 309 of the PLC 310 based on $T_{Leakage}$ 331 and $T_{Leakage+Control}$ 333. More specifically, it is to be appreciated that the capacitance of a capacitor may be given by:

$$I(t) = C\frac{dV(t)}{dt}. \quad \text{Equation 1}$$

Based on Equation 1, the capacitance $C_{PL}$ 309 of the PLC 310 may be given by either:

$$T_{Leakage} = \frac{C_{PL} \times V_{Ripple}}{I_{Leakage}}; \quad \text{Equation 2}$$

or $$T_{Leakage+Control} = \frac{C_{PL} \times V_{Ripple}}{I_{Leakage} + I_{Control}}. \quad \text{Equation 3}$$

It follows from Equations 2 and 3 that:

$$I_{Leakage} = \frac{C_{PL} \times V_{Ripple}}{T_{Leakage}}; \quad \text{Equation 4}$$

and $$C_{PL} = \frac{(I_{Leakage} + I_{Control}) \times T_{Leakage + Control}}{V_{Ripple}}. \quad \text{Equation 5}$$

Substituting Equation 4 into Equation 5 yields:

$$C_{PL} = \frac{\left(\frac{C_{PL} \times V_{Ripple}}{T_{Leakage}} + I_{Control}\right) \times T_{Leakage + Control}}{V_{Ripple}}. \quad \text{Equation 6}$$

Simplifying Equation 6 yields:

$$C_{PL} = \frac{I_{Control} \times T_{Leakage + Control}}{V_{Ripple} \times \left(1 - \frac{T_{Leakage + Control}}{T_{Leakage}}\right)}. \quad \text{Equation 7}$$

Equation 7 may be used to determine the capacitance $C_{PL}$ 309 of the PLC 310 based on $T_{Leakage}$ 331 and $T_{Leakage+Control}$ 333. More specifically, the $C_{PL}$ capacitance measurement component 320 may derive capacitance $C_{PL}$ 309 of the PLC 310 based on $T_{Leakage}$ 331, $T_{Leakage+Control}$ 333, $V_{Ripple}$ 325, and $I_{control}$ 313.

Included herein is a set of logic flows representative of example methodologies for performing novel aspects of the disclosed architecture. While, for purposes of simplicity of explanation, the one or more methodologies shown herein are shown and described as a series of acts, those skilled in the art will understand and appreciate that the methodologies are not limited by the order of acts. Some acts may, in accordance therewith, occur in a different order and/or concurrently with other acts from that shown and described herein. For example, those skilled in the art will understand and appreciate that a methodology could alternatively be represented as a series of interrelated states or events, such as in a state diagram. Moreover, not all acts illustrated in a methodology may be required for a novel implementation.

A logic flow may be implemented in software, firmware, and/or hardware. In software and firmware embodiments, a logic flow may be implemented by computer executable instructions stored on at least one non-transitory computer readable medium or machine readable medium, such as an optical, magnetic or semiconductor storage. The embodiments are not limited in this context.

FIG. 9 illustrates an example of a first logic flow. As shown in this figure, the first logic flow includes a logic flow 900. Logic flow 900 may be representative of some or all of the operations executed by one or more logic, features, or devices described herein, such as PLSS 126, PLSS 200, or PLSS 300.

In this illustrated example, logic flow 900 at block 910 may determine a first discharge time between a first time and a second time during that a voltage across a capacitor drops from an operating voltage to a threshold voltage. For example, at block 910 a time to discharge the PLC 310 from $V_{Operating}$ 321 and $V_{Threshold}$ 323 may be determined. In particular, the PLC capacitance measurement component 330 may determine $T_{Leakage}$ 331 at block 910.

The logic flow 900 at block 920 may determine a second discharge time that the voltage across the capacitor drops from the operating voltage to the threshold voltage in response to discharging a control current from the capacitor. For example, at block 920 a time to discharge the PLC 310 from $V_{Operating}$ 321 and $V_{Threshold}$ 323 may be determined when the control current sink 340 is operably coupled to the PLC 310. In particular, the PLC capacitance measurement component 330 may determine $T_{Leakage+Control}$ 333 at block 920.

The logic flow 900 at block 930 may determine a capacitance of the capacitor based on the first discharge time and the second discharge time. For example, at block 930, the capacitance $C_{PL}$ 309 of the PLC 310 may be determined based on $T_{Leakage}$ 331, $T_{Leakage+Control}$ 333, $V_{Ripple}$ 325, and $I_{Control}$ 313.

In some examples, the power management system 126, the PLSS 200, and/or the PLSS 300 may include logic to implement operations detailed by the following algorithm. For example, the logic may first write a CAP_TEST_START bit with '0' in a PMIC register CAP_TEST_CTRL at address 0x18. Additionally, the logic may write a DONE CLR bit with '1' in the PMIC register CAP_TEST_INT at address 0x19. Additionally, the logic may write a CAP_TEST_TICKS0 at the PMIC address 0x16 and CAP_TEST_TICKS1 at the PMIC address 0x17 with 0x00. Additionally, the logic may write a DONE_MASK bit with '0' in the PMIC register CAP_TEST_INT at address 0x19. Additionally, the logic may write a CAP_TEST_START bit with '1' in the PMIC register CAP_TEST_CTRL at address 0x18. Additionally, the logic may wait for a GEN_INT_N and determine whether that the CAP_TEST_DONE bit='1' in the PMIC register CAP_TEST_INT at address 0x19. Additionally, the logic may Read the CAP_TEST_TICKS0 at the PMIC address 0x16 and the CAP_TEST_TICKS1 at PMIC address 0x17. Additionally, the logic may write the DONE CLR bit with '1' in the PMIC register CAP_TEST_INT at address 0x19. Additionally, the logic may write the DONE_MASK bit with '1' in PMIC register CAP_TEST_INT at address 0x19. Additionally, the logic may determine the capacitance (e.g., $C_{PL}$) of the power loss capacitor. In some examples, the logic repeatedly or periodically determines the capacitance. Additionally, the logic may determine whether the capacitance exceeds a threshold capacitance. Additionally, the logic may send a control signal (e.g., PCIe, NVMe, or the like) to set a flag to indicate that the power loss shutdown system has failed based on a determination that the capacitance does not exceed the threshold voltage.

Figure 10:
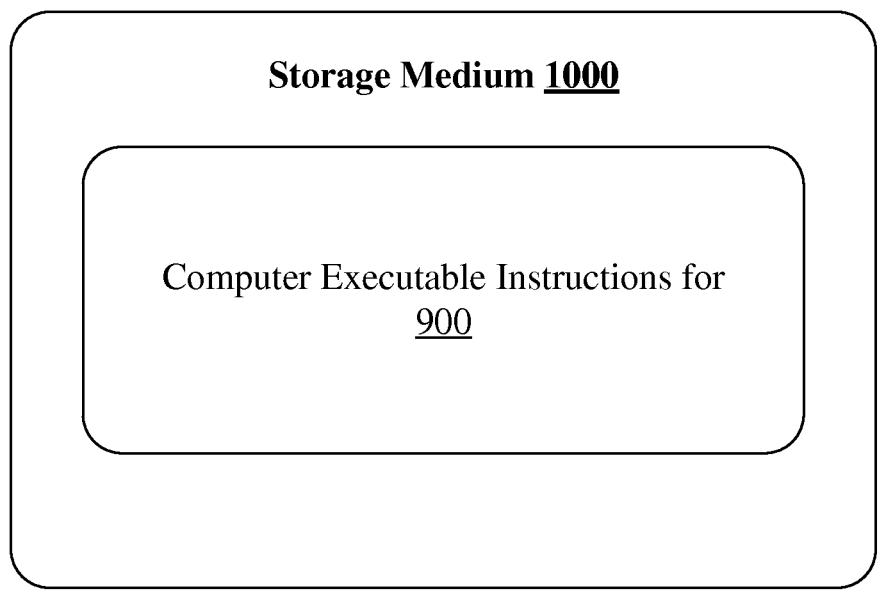
FIG. 10 illustrates an example storage medium.

FIG. 10 illustrates an example of a first storage medium. As shown in this figure, the first storage medium includes a storage medium 1000. The storage medium 1000 may comprise an article of manufacture. In some examples, storage medium 1000 may include any non-transitory computer readable medium or machine readable medium, such as an optical, magnetic or semiconductor storage. Storage medium 1000 may store various types of computer executable instructions, such as instructions to implement logic flow 900. Examples of a computer readable or machine readable storage medium may include any tangible media capable of storing electronic data, including volatile memory or non-volatile memory, removable or non-removable memory, erasable or non-erasable memory, writeable or re-writeable memory, and so forth. Examples of computer executable instructions may include any suitable type of code, such as source code, compiled code, interpreted code, executable code, static code, dynamic code, object-oriented code, visual code, and the like. The examples are not limited in this context.

Figure 11:
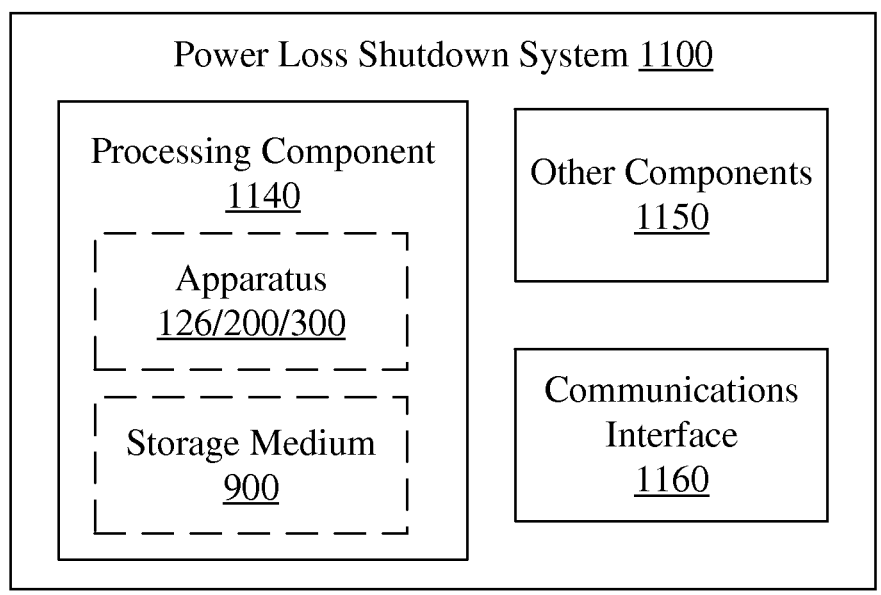
FIG. 11 illustrates an example power loss shutdown system.

FIG. 11 illustrates an example power
system 1100. In some examples, as shown in this figure, the power loss shutdown system 1100 may include a processing component 1140, other components 1150, or a communications interface 1160. According to some examples, power loss shutdown system 1100 may be implemented in an SSD as mentioned above.

According to some examples, processing component 1140 may execute processing operations or logic for apparatus 300 and/or storage medium 1000. Processing component 1140 may include various hardware elements, software elements, or a combination of both. Examples of hardware elements may include devices, logic devices, components, processors, microprocessors, circuits, processor circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), memory units, logic gates, registers, semiconductor device, chips, microchips, chip sets, and so forth. Examples of software elements may include software components, programs, applications, computer programs, application programs, device drivers, system programs, software development programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given example.

In some examples, other components 1150 may include common computing elements or circuitry, such as one or more processors, multi-core processors, co-processors, memory units, interfaces, oscillators, timing devices, and so forth. Examples of memory units may include without limitation various types of computer readable and machine readable storage media in the form of one or more higher speed memory units, such as read-only memory (ROM), random-access memory (RAM), dynamic RAM (DRAM), Double-Data-Rate DRAM (DDRAM), synchronous DRAM (SDRAM), static RAM (SRAM), programmable ROM (PROM), erasable programmable ROM (EPROM), electrically erasable programmable ROM (EEPROM), flash memory or any other type of storage media suitable for storing information.

In some examples, communications interface 1160 may include logic and/or features to support a communication interface. For these examples, communications interface 1160 may include one or more communication interfaces that operate according to various communication protocols or standards to communicate over communication links or channels. Communications may occur via use of communication protocols or standards described in one or more industry standards (including progenies and variants) such as those associated with the PCI Express, SATA or SCSI standard or specifications.

The components and features of power loss shutdown system 1100 may be implemented using any combination of discrete circuitry, application specific integrated circuits (ASICs), logic gates and/or single chip architectures. Further, the features of power loss shutdown system 1100 may be implemented using microcontrollers, programmable logic arrays and/or microprocessors or any combination of the foregoing where suitably appropriate. It is noted that hardware, firmware and/or software elements may be collectively or individually referred to herein as "logic" or "circuit."

It should be appreciated that the example power loss shutdown system 1100 shown in the block diagram of this figure may represent one functionally descriptive example of many potential implementations. Accordingly, division, omission or inclusion of block functions depicted in the accompanying figures does not infer that the hardware components, circuits, software and/or elements for implementing these functions would necessarily be divided, omitted, or included in embodiments.

One or more aspects of at least one example may be implemented by representative instructions stored on at least one machine-readable medium which represents various logic within the processor, which when read by a machine, computing device or system causes the machine, computing device or system to fabricate logic to perform the techniques described herein. Such representations may be stored on a tangible, machine readable medium and supplied to various customers or manufacturing facilities to load into the fabrication machines that actually make the logic or processor.

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, ASICs, PLDs, DSPs, FPGAs, memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation.

Some examples may include an article of manufacture or at least one computer-readable medium. A computer-readable medium may include a non-transitory storage medium to store logic. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the logic may include various software elements, such as software components, programs, applications, computer programs, application programs, system programs, machine programs, operating system software, middleware, firmware, software modules, routines, subroutines, functions, methods, procedures, software interfaces, API, instruction sets, computing code, computer code, code segments, computer code segments, words, values, symbols, or any combination thereof.

According to some examples, a computer-readable medium may include a non-transitory storage medium to store or maintain instructions that when executed by a machine, computing device or system, cause the machine, computing device or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a machine, computing device or system to perform a certain function. The instructions may be implemented using any suitable high-level, low-level, object-oriented, visual, compiled and/or interpreted programming language.

Some examples may be described using the expression "in one example" or "an example" along with their derivatives. These terms mean that a particular feature, structure, or characteristic described in connection with the example is included in at least one example. The appearances of the phrase "in one example" in various places in the specification are not necessarily all referring to the same example.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

It is emphasized that the Abstract of the Disclosure is provided to comply with 37 C.F.R. Section 1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single example for the purpose of streamlining the disclosure. This method of disclosure is not to be interpreted as reflecting an intention that the claimed examples require more features than are expressly recited in each claim. Rather, as the following claims reflect, inventive subject matter lies in less than all features of a single disclosed example. Thus the following claims are hereby incorporated into the Detailed Description, with each claim standing on its own as a separate example. In the appended claims, the terms "including" and "in which" are used as the plain-English equivalents of the respective terms "comprising" and "wherein," respectively. Moreover, the terms "first," "second," "third," and so forth, are used merely as labels, and are not intended to impose numerical requirements on their objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The following examples of the present disclosure are provided.

Example 1

An apparatus comprising: a capacitor; and a component to: determine a first discharge time between a first time and a second time that a voltage across the capacitor drops from an operating voltage to a threshold voltage; determine a second discharge time that the voltage across the capacitor drops from the operating voltage to the threshold voltage in response to discharging a control current from the capacitor; and determine a capacitance of the capacitor based on the first discharge time and the second discharge time.

Example 2

The apparatus of example 1, the component to measure the first discharge time and the second discharge time.

Example 3

The apparatus of example 1, comprising a power loss shutdown system for a solid state drive, the capacitor an energy storage component of the power loss shutdown system.

Example 4

The apparatus of example 3, the component to: determine whether the capacitance is below a threshold capacitance; and send a control signal to a host system based on a determination that the capacitance is below the threshold capacitance, the control signal to include an indication that the capacitor may not provide sufficient energy to protect data integrity in the event of a loss of power to the solid state drive.

Example 5

The apparatus of example 1, the capacitor comprising a plurality of capacitors.

Example 6

The apparatus of example 1, comprising a control current sink selectively coupled to the capacitor, the component to send a control signal to electrically couple the control current sink and the capacitor during the second time, the control current sink to sink the control current from the capacitor.

Example 7

The apparatus of example 1, comprising a power source to charge the capacitor to the operating voltage.

Example 8

The apparatus of example 1, the component to determine the capacitance as a quotient wherein the dividend is the product of the control current and the second discharge time and the divisor is the product of the difference between the operating voltage and the threshold voltage and the difference between 1 and the second discharge time divided by the first discharge time.

Example 9

A computer-implemented method comprising: determining a first discharge time between a first time and a second time that a voltage across the capacitor drops from an operating voltage to a threshold voltage; determining a second discharge time that the voltage across the capacitor drops from the operating voltage to the threshold voltage in response to discharging a control current from the capacitor;

and determining a capacitance of the capacitor based on the first discharge time and the second discharge time.

Example 10

The computer-implemented method of example 9, comprising measuring the first discharge time and the second discharge time.

Example 11

The computer-implemented method of example 9, the capacitor an energy storage component of a power loss shutdown system of a solid state drive.

Example 12

The computer-implemented method of example 11, comprising: determining whether the capacitance is below a threshold capacitance; and sending a control signal to a host system based on a determination that the capacitance is below the threshold capacitance, the control signal to include an indication that the capacitor may not provide sufficient energy to protect data integrity in the event of a loss of power to the solid state drive.

Example 13

The computer-implemented method of example 9, the capacitor comprising a plurality of capacitors.

Example 14

The computer-implemented method of example 9, comprising sending a control signal to electrically couple a control current sink to the capacitor during the second time, the control current sink to sink the control current from the capacitor.

Example 15

The computer-implemented method of example 9, comprising charging the capacitor to the operating voltage.

Example 16

The computer-implemented method of example 9, comprising determining the capacitance as a quotient wherein the dividend is the product of the control current and the second discharge time and the divisor is the product of the difference between the operating voltage and the threshold voltage and the difference between 1 and the second discharge time divided by the first discharge time.

Example 17

At least one machine readable medium comprising a plurality of instructions that in response to be executed by system at a host computing platform cause the system to carry out a method according to any one of examples 9 to 16.

Example 18

An apparatus comprising means for performing the methods of any one of examples 9 to 16.

Example 19

At least one machine readable medium comprising a plurality of instructions that in response to be executed on system at a memory device cause the system to: determine a first discharge time between a first time and a second time that a voltage across a capacitor drops from an operating voltage to a threshold voltage; determine a second discharge time that the voltage across the capacitor drops from the operating voltage to the threshold voltage in response to discharging a control current from the capacitor; and determine a capacitance of the capacitor based on the first discharge time and the second discharge time.

Example 20

The at least one machine readable medium of example 19, the instructions to further cause the system to measure the first discharge time and the second discharge time.

Example 21

The at least one machine readable medium of example 19, the capacitor an energy storage component of a power loss shutdown system of a solid state drive.

Example 22

The at least one machine readable medium of example 21, the instructions to further cause the system to: determine whether the capacitance is below a threshold capacitance; and send a control signal to a host system based on a determination that the capacitance is below the threshold capacitance, the control signal to include an indication that the capacitor may not provide sufficient energy to protect data integrity in the event of a loss of power to the solid state drive.

Example 23

The at least one machine readable medium of example 19, the capacitor comprising a plurality of capacitors.

Example 24

The at least one machine readable medium of example 19, the instructions to further cause the system to send a control signal to electrically couple a control current sink to the capacitor during the second discharge time, the control current sink to sink the control current from the capacitor.

Example 25

The at least one machine readable medium of example 19, the instructions to further cause the system to charge the power loss capacitor to the operating voltage.

Example 26

The at least one machine readable medium of example 19, the instructions to further cause the system to determine the capacitance as a quotient wherein the dividend is the product of the control current and the second discharge time and the divisor is the product of the difference between the operating voltage and the threshold voltage and the difference between 1 and the second discharge time divided by the first discharge time.

Example 27

A system comprising: a solid state drive; and a power loss shutdown system to provide data integrity for the solid state drive in the event of a loss of power, the power loss shutdown system comprising: a capacitor; and logic, at least a portion of which is in hardware, the logic to: determine a first discharge time between a first time and a second time that a voltage across the capacitor drops from an operating voltage to a threshold voltage; determine a second discharge time that the voltage across the capacitor drops from the operating voltage to the threshold voltage in response to discharging a control current from the capacitor; and determine a capacitance of the capacitor based on the first discharge time and the second discharge time.

Example 28

The system of example 27, the logic to measure the first discharge time and the second discharge time.

Example 29

The system of example 27, the logic to: determine whether the capacitance is below a threshold capacitance; and send a control signal to a host system based on a determination that the capacitance is below the threshold capacitance, the control signal to include an indication that the capacitor may not provide sufficient energy to protect data integrity in the event of a loss of power to the solid state drive.

Example 30

The system of example 27, the power loss capacitor comprising a plurality of capacitors.

Example 31

The system of example 27, comprising a control current sink selectively coupled to the capacitor, the logic to send a control signal to electrically couple the control current sink and the capacitor during the second discharge time.

Example 32

The system of example 27, comprising a power source to charge the power loss capacitor to the operating voltage.

Example 33

The system of example 27, the logic to determine the capacitance as a quotient wherein the dividend is the product of the control current and the second discharge time and the divisor is the product of the difference between the operating voltage and the threshold voltage and the difference between 1 and the second discharge time divided by the first discharge time.

Example 34

The system of example 27, the solid state drive comprising at least one of NAND memory, NOR memory, 3-Dimensional cross-point memory, ferroelectric memory, silicon-oxide-nitride-oxide-silicon (SONOS) memory, polymer memory, ferroelectric polymer memory, ferroelectric transistor random access memory, nanowire memory, phase change memory, phase change memory with switch, magnetoresistive random access memory (MRAM), or spin transfer torque (STT) memory.

Example 35

A solid state drive comprising: a non-volatile memory array; a capacitor operably coupled to the non-volatile memory array; and a controller, at least a portion of which is in hardware, the controller to: determine a first discharge time between a first time and a second time that a voltage across to discharge the capacitor from an operating voltage to a threshold voltage; determine a second discharge time that the voltage across the capacitor drops from the operating voltage to the threshold voltage in response to discharging a control current from the capacitor; and determine a capacitance of the capacitor based on the first discharge time and the second discharge time.

36

The solid state drive of example 35, the non-volatile memory array comprising NAND memory, NOR memory, 3-Dimensional cross-point memory, ferroelectric memory, silicon-oxide-nitride-oxide-silicon (SONOS) memory, polymer memory, ferroelectric polymer memory, ferroelectric transistor random access memory (FeTRAM or FeRAM), nanowire, phase change memory, phase change memory with switch, magnetoresistive random access memory (MRAM), or spin transfer torque (STT) memory.

Example 37

The solid state drive of example 35, the controller to: determine whether the capacitance is below a threshold capacitance; and send a control signal to a host system based on a determination that the capacitance is below the threshold capacitance, the control signal to include an indication that the capacitor may not provide sufficient energy to protect data integrity in the event of a loss of power to the solid state drive.

Example 38

The solid state drive of example 35, the controller to send a control signal to electrically couple a control current sink to the capacitor during the second time, the control current sink to sink the control current from the capacitor.

Example 39

The solid state drive of example 35, the controller to determine the capacitance as a quotient wherein the dividend is the product of the control current and the second discharge time and the divisor is the product of the difference between the operating voltage and the threshold voltage and the difference between 1 and the second discharge time divided by the first discharge time.

What is claimed is:
1. An apparatus comprising:
a capacitor of a solid state drive; and
a component to:
determine a first discharge time between a first time and a second time that a voltage across the capacitor drops from an operating voltage to a threshold voltage;
determine a second discharge time that the voltage across the capacitor drops from the operating voltage to the threshold voltage in response to discharging a control current from the capacitor;

determine a capacitance of the capacitor based on the first discharge time and the second discharge time;
determine whether the capacitance is below a threshold capacitance; and
send a control signal to a host system based on a determination that the capacitance is below the threshold capacitance, the control signal to include an indication that the capacitor may not provide sufficient energy to protect data integrity in the event of a loss of power to the solid state drive.

2. The apparatus of claim 1, the component to measure the first discharge time and the second discharge time.

3. The apparatus of claim 1, comprising a power loss shutdown system for a solid state drive, the capacitor an energy storage component of the power loss shutdown system.

4. The apparatus of claim 1, the capacitor comprising a plurality of capacitors.

5. The apparatus of claim 1, comprising a control current sink selectively coupled to the capacitor, the component to send a control signal to electrically couple the control current sink and the capacitor during the second time, the control current sink to sink the control current from the capacitor.

6. The apparatus of claim 1, comprising a power source to charge the capacitor to the operating voltage.

7. The apparatus of claim 1, the component to determine the capacitance as a quotient wherein the dividend is the product of the control current and the second discharge time and the divisor is the product of the difference between the operating voltage and the threshold voltage and the difference between 1 and the second discharge time divided by the first discharge time.

8. A computer-implemented method comprising:
determining a first discharge time between a first time and a second time that a voltage across the capacitor drops from an operating voltage to a threshold voltage, the capacitor a capacitor in a solid state drive;
determining a second discharge time that the voltage across the capacitor drops from the operating voltage to the threshold voltage in response to discharging a control current from the capacitor;
determining a capacitance of the capacitor based on the first discharge time and the second discharge time;
determining whether the capacitance is below a threshold capacitance; and
sending a control signal to a host system based on a determination that the capacitance is below the threshold capacitance, the control signal to include an indication that the capacitor may not provide sufficient energy to protect data integrity in the event of a loss of power to the solid state drive.

9. The computer-implemented method of claim 8, comprising measuring the first discharge time and the second discharge time.

10. The computer-implemented method of claim 8, the capacitor an energy storage component of a power loss shutdown system of a solid state drive.

11. The computer-implemented method of claim 8, the capacitor comprising a plurality of capacitors.

12. The computer-implemented method of claim 8, comprising sending a control signal to electrically couple a control current sink to the capacitor during the second time, the control current sink to sink the control current from the capacitor.

13. The computer-implemented method of claim 8, comprising charging the capacitor to the operating voltage.

14. The computer-implemented method of claim 8, comprising determining the capacitance as a quotient wherein the dividend is the product of the control current and the second discharge time and the divisor is the product of the difference between the operating voltage and the threshold voltage and the difference between 1 and the second discharge time divided by the first discharge time.

15. A solid state drive comprising:
a non-volatile memory array;
a capacitor operably coupled to the non-volatile memory array; and
a controller, at least a portion of which is in hardware, the controller to:
determine a first discharge time between a first time and a second time that a voltage across to discharge the capacitor from an operating voltage to a threshold voltage;
determine a second discharge time that the voltage across the capacitor drops from the operating voltage to the threshold voltage in response to discharging a control current from the capacitor;
determine a capacitance of the capacitor based on the first discharge time and the second discharge time;
determine whether the capacitance is below a threshold capacitance; and
send a control signal to a host system based on a determination that the capacitance is below the threshold capacitance, the control signal to include an indication that the capacitor may not provide sufficient energy to protect data integrity in the event of a loss of power to the solid state drive.

16. The solid state drive of claim 15, the non-volatile memory array comprising NAND memory, NOR memory, 3-Dimensional cross-point memory, ferroelectric memory, silicon-oxide-nitride-oxide-silicon (SONOS) memory, polymer memory, ferroelectric polymer memory, ferroelectric transistor random access memory (FeTRAM or FeRAM), nanowire, phase change memory, phase change memory with switch, magnetoresistive random access memory (MRAM), or spin transfer torque (STT) memory.

17. The solid state drive of claim 15, the controller to send a control signal to electrically couple a control current sink to the capacitor during the second time, the control current sink to sink the control current from the capacitor.

18. The solid state drive of claim 15, the controller to determine the capacitance as a quotient wherein the dividend is the product of the control current and the second discharge time and the divisor is the product of the difference between the operating voltage and the threshold voltage and the difference between 1 and the second discharge time divided by the first discharge time.

19. A system comprising:
a solid state drive; and
a power loss shutdown system to provide data integrity for the solid state drive in the event of a loss of power, the power loss shutdown system comprising:
a capacitor; and
logic, at least a portion of which is in hardware, the logic to:
determine a first discharge time between a first time and a second time that a voltage across the capacitor drops from an operating voltage to a threshold voltage;
determine a second discharge time that the voltage across the capacitor drops from the operating voltage to the threshold voltage in response to discharging a control current from the capacitor;

determine a capacitance of the capacitor based on the first discharge time and the second discharge time;
determine whether the capacitance is below a threshold capacitance; and
send a control signal to a host system based on a determination that the capacitance is below the threshold capacitance, the control signal to include an indication that the capacitor may not provide sufficient energy to protect data integrity in the event of a loss of power to the solid state drive.

20. The system of claim 19, comprising:
a control current sink selectively coupled to the capacitor, the logic to send a control signal to electrically couple the control current sink and the capacitor during the second discharge time; and
a power source to charge the capacitor to the operating voltage.

21. The system of claim 19, the logic to determine the capacitance as a quotient wherein the dividend is the product of the control current and the second discharge time and the divisor is the product of the difference between the operating voltage and the threshold voltage and the difference between 1 and the second discharge time divided by the first discharge time.

22. The system of claim 19, the solid state drive comprising at least one of NAND memory, NOR memory, 3-Dimensional cross-point memory, ferroelectric memory, silicon-oxide-nitride-oxide-silicon (SONOS) memory, polymer memory, ferroelectric polymer memory, ferroelectric transistor random access memory, nanowire memory, phase change memory, phase change memory with switch, magnetoresistive random access memory (MRAM), or spin transfer torque (STT) memory.

* * * * *